(12) United States Patent
Yamada et al.

(10) Patent No.: US 9,029,993 B2
(45) Date of Patent: *May 12, 2015

(54) SEMICONDUCTOR DEVICE INCLUDING SEMICONDUCTOR CHIP MOUNTED ON LEAD FRAME

(71) Applicant: DENSO CORPORATION, Kariya, Aichi-pref. (JP)

(72) Inventors: Masao Yamada, Kariya (JP); Tetsuo Fujii, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/091,507

(22) Filed: Nov. 27, 2013

(65) Prior Publication Data

US 2014/0084437 A1 Mar. 27, 2014

Related U.S. Application Data

(62) Division of application No. 12/588,739, filed on Oct. 27, 2009, now Pat. No. 8,624,367.

(30) Foreign Application Priority Data

Oct. 30, 2008 (JP) ................................. 2008-279791
Jul. 10, 2009 (JP) ................................. 2009-163662

(51) Int. Cl.
*H01L 23/495* (2006.01)
*H01L 23/00* (2006.01)

(52) U.S. Cl.
CPC .... *H01L 23/49575* (2013.01); *H01L 23/49589* (2013.01); *H01L 24/48* (2013.01);
(Continued)

(58) Field of Classification Search
USPC ....................................... 257/676, 666, E23.01
See application file for complete search history.

(56) References Cited

U.S. PATENT DOCUMENTS 6,467,142 B1   10/2002  Shirashige et al.
2005/0200007 A1   9/2005  Liu
(Continued)

FOREIGN PATENT DOCUMENTS

JP   08-250646 A    9/1996
JP   2000-058740 A  2/2000
(Continued)

OTHER PUBLICATIONS

Chinese Office Action issued on May 18, 2011 issued from the Chinese Patent Office in the corresponding Chinese patent application No. 200910207690.7 (with English translation).
(Continued)

*Primary Examiner* — Jamie C Niesz
(74) *Attorney, Agent, or Firm* — Posz Law Group, PLC

(57) ABSTRACT

A semiconductor device includes a lead frame, a semiconductor chip, a substrate, a plurality of chip parts, a plurality of wires, and a resin member. The lead frame includes a chip mounted section and a plurality of lead sections. The semiconductor chip is mounted on the chip mounted section. The substrate is mounted on the chip mounted section. The chip parts are mounted on the substrate. Each of the chip parts has a first end portion and a second end portion in one direction, and each of the chip parts has a first electrode at the first end portion and a second electrode at the second end portion. Each of the wires couples the second electrode of one of the chip parts and one of the lead sections. The resin member covers the lead frame, the semiconductor chip, the substrate, the chip parts, and the wires.

2 Claims, 13 Drawing Sheets

(52) U.S. Cl.
CPC ............... *H01L2224/48091* (2013.01); *H01L 2224/48195* (2013.01); *H01L 2224/48247* (2013.01); *H01L 2224/484* (2013.01); *H01L 2224/4911* (2013.01); *H01L 2224/49171* (2013.01); *H01L 2924/01004* (2013.01); *H01L 2924/01005* (2013.01); *H01L 2924/01082* (2013.01); *H01L 2924/014* (2013.01); *H01L 2924/14* (2013.01); *H01L 2924/19041* (2013.01); *H01L 2924/01006* (2013.01); *H01L 2924/01033* (2013.01); *H01L 24/49* (2013.01); *H01L 2924/07802* (2013.01)

(56) References Cited

U.S. PATENT DOCUMENTS

| | | | |
|---|---|---|---|
| 2006/0262489 | A1 | 11/2006 | Vaisman et al. |
| 2007/0126117 | A1 | 6/2007 | Fujiwara |
| 2008/0023843 | A1* | 1/2008 | Hiraga .......................... 257/773 |

FOREIGN PATENT DOCUMENTS

| | | |
|---|---|---|
| JP | 2003-017650 A | 1/2003 |
| JP | 2005-236171 A | 9/2005 |
| JP | 2006-32470 A | 2/2006 |
| JP | 2006-245618 A | 9/2006 |
| WO | 99/34444 A1 | 7/1999 |

OTHER PUBLICATIONS

Japanese Office Action mailed Aug. 9, 2011 from the Japanese Patent Office in the corresponding Japanese patent application 2009-163662 (with English translation).

Chinese Office Action issued on Mar. 7, 2012 issued from the Chinese Patent Office in the corresponding Chinese patent application No. 2009102076903 (with English translation).

Chinese Office Action dated Oct. 10, 2012 issued from the Chinese Patent Office in the corresponding Chinese patent application No. 2009102076903 (with English translation).

Office Action dated Apr. 25, 2014 issued in corresponding CN patent application No. 200910207690.7 (and English translation).

Office Action dated Sep. 29, 2014 issued in corresponding CN patent application No. 200910207690.7 (and English translation).

Office Action dated Jan. 30, 2015 issued in corresponding CN patent application No. 201310063230.8 (and English translation).

\* cited by examiner

SEMICONDUCTOR DEVICE INCLUDING SEMICONDUCTOR CHIP MOUNTED ON LEAD FRAME

CROSS REFERENCE TO RELATED APPLICATIONS

The present application is a divisional of application Ser. No. 12/588,739 filed on Oct. 27, 2008, which is based on and claims priority to Japanese Patent Applications No. 2008-279791 filed on Oct. 30, 2008, and No. 2009-163662 filed on Jul. 10, 2009, the contents of which are incorporated in their entirety herein by reference.

BACKGROUND OF THE INVENTION

1. Field of the Invention

The present invention relates to a semiconductor device including a semiconductor chip mounted on a lead frame.

2. Description of the Related Art

A semiconductor device such as an integrated circuit (ID) and a large-scale integration (LSI) includes a lead frame and a semiconductor chip mounted on the lead frame, and the semiconductor chip and the lead frame are molded with resin as described, for example, in JP-A-2000-58740. A semiconductor device in which a chip capacitor for reducing noise or static electricity is sealed in a resin member is also known.

An example of a semiconductor device in which a chip capacitor is sealed in a resin member is illustrated in FIG. 24. The semiconductor device includes a lead frame 1, a semiconductor chip 3, and chip capacitors 5. The semiconductor chip 3 is mounted on a chip mounted section 2 of the lead frame 1. The chip capacitors 5 are arranged so as to bridge between lead sections 4a-4f of the lead frame 1 or between the lead sections 4a-4f and the chip mounted section 2. The chip mounted section 2 and the lead section 4c are at a ground potential. The chip mounted section 2 and the lead sections 4a, 4b, 4d, 4f are bonded with pads of the semiconductor chip 3 through wires 6. The lead frame 1, the semiconductor chip 3, and the chip capacitors 5 are covered with a resin member 7.

In the above-described semiconductor device, a dimension of the lead frame 1 may increase when the lead frame 1 is designed so that the chip capacitors 5 are arranged between required potentials.

SUMMARY OF THE INVENTION

In view of the foregoing problems, it is an object of the present invention to provide a semiconductor device in which a dimension of a lead frame can be reduced.

A semiconductor device according to a first aspect of the present invention includes a lead frame, a semiconductor chip, a substrate, a plurality of chip parts, a plurality of wires, and a resin member. The lead frame includes a chip mounted section and a plurality of lead sections. The semiconductor chip is mounted on the chip mounted section. The substrate is mounted on the chip mounted section. The chip parts are mounted on the substrate. Each of the chip parts has a first end portion and a second end portion in one direction, and each of the chip parts has a first electrode at the first end portion and a second electrode at the second end portion. Each of the wires couples the second electrode of one of the chip parts and one of the lead sections. The resin member covers the lead frame, the semiconductor chip, the substrate, the chip parts, and the wires.

In the semiconductor device according to the first aspect, a dimension of the lead frame can be reduced, and thereby a dimension of the semiconductor device can be reduced.

A semiconductor device according to a second aspect of the present invention includes a lead frame, a semiconductor chip, a plurality of chip parts, a conductive adhesive, an insulating adhesive, a plurality of wires, and a resin member. The lead frame includes a chip mounted section and a plurality of lead sections. The semiconductor chip is mounted on the chip mounted section. Each of the chip parts is mounted on a surface of one the lead sections. Each of the chip parts has a first end portion and a second end portion in a direction parallel to the surface, and each of the chip parts has a first electrode at the first end portion and a second electrode at the second end portion. The conductive adhesive is disposed between the first electrode of each of the chip parts and a corresponding one of the lead sections. The insulating adhesive is disposed between the second electrode of each of the chip parts and the corresponding one of the lead sections. Each of the wires is coupled to the second electrode of one of the chip parts. The resin member covers the lead frame, the semiconductor chip, the chip parts, the conductive adhesive, the insulating adhesive, and the wires.

In the semiconductor device according to the second aspect, a dimension of the lead frame can be reduced, and thereby a dimension of the semiconductor device can be reduced.

A semiconductor device according to a third aspect of the present invention includes a lead frame, a semiconductor chip, a plurality of chip parts, a conductive plate, a conductive adhesive, an insulating adhesive, and a resin member. The lead frame includes a chip mounted section and a plurality of lead sections. The semiconductor chip is mounted on the chip mounted section. Each of the chip parts is mounted on one the lead sections. Each of the chip parts has a first end portion and a second end portion in a direction parallel to the lead sections, and each of the chip parts has a first electrode at the first end portion and a second electrode at the second end portion. The conductive plate is disposed on the chip parts. The conductive adhesive is disposed between the first electrode of each of the chip parts and a corresponding one of the lead sections and between the second electrode of each of the chip parts and the conductive plate. The insulating adhesive is disposed between the second electrode of each of the chip parts and the corresponding one of the lead sections and between the first electrode of each of the chip parts and the conductive plate. The resin member covers the lead frame, the semiconductor chip, the chip parts, the conductive plate, the conductive adhesive, and the insulating adhesive.

In the semiconductor device according to the third aspect, a dimension of the lead frame can be reduced, and thereby a dimension of the semiconductor device can be reduced.

A semiconductor device according to fourth aspect of the present invention includes a lead frame, a semiconductor chip, a plurality of chip parts, a conductive plate, and a resin member. The lead frame includes a chip mounted section and a plurality of lead sections. The semiconductor chip is mounted on the chip mounted section. Each of the chip parts is mounted on a surface of one the lead sections. Each of the chip parts has a first end portion and a second end portion in a direction perpendicular to the surface, and the first end portion is located on the surface. Each of the chip parts has an electrode at each of the first end portion and the second end portion. The conductive plate is disposed on the second end portions of the chip parts and coupled to a ground potential. The resin member covers the lead frame, the semiconductor chip, the chip parts, and the conductive plate.

In the semiconductor device according to the fourth aspect, a dimension of the lead frame can be reduced, and thereby a dimension of the semiconductor device can be reduced.

A semiconductor device according to a fifth aspect of the present invention includes a lead frame, a semiconductor chip, a plurality of chip parts, and a resin member. The lead frame includes a chip mounted section and a plurality of lead sections. The semiconductor chip is mounted on the chip mounted section. Each of the chip parts is mounted on a surface of one the lead sections. Each of the chip parts has a first end portion and a second end portion in a direction perpendicular to the surface, and the first end portion is located on the surface. Each of the chip parts has an electrode at each of the first end portion and the second end portion. The resin member covers the lead frame, the semiconductor chip, and the chip parts in such a manner that the second end portion of each of the chip parts is exposed to an outside of the resin member.

In the semiconductor device according to the fifth aspect, a dimension of the lead frame can be reduced, and thereby a dimension of the semiconductor device can be reduced.

A semiconductor device according to a sixth aspect of the present invention includes a lead frame, a semiconductor chip, a plurality of chip parts, and a resin member. The lead frame includes a chip mounted section and a plurality of lead sections. The chip mounted section having a plurality of lead parts adjacent to the plurality of lead sections. The semiconductor chip is mounted on the chip mounted section. Each of the chip parts is mounted on a surface of one the plurality of lead sections. Each of the chip parts has a first end portion and a second end portion in a direction perpendicular to the surface, and the first end portion is located on the surface. Each of the chip parts has an electrode at each of the first end portion and the second end portion. The resin member covers the lead frame, the semiconductor chip, and the chip parts. Each of the lead parts is bent and an end portion of each of the lead parts is disposed on the second end portion of one of the plurality of chip parts.

In the semiconductor device according to the sixth aspect, a dimension of the lead frame can be reduced, and thereby a dimension of the semiconductor device can be reduced.

A semiconductor device according to a seventh aspect of the present invention includes a lead frame, a semiconductor chip, a plurality of chip parts, and a resin member. The lead frame includes a chip mounted section and a plurality of lead sections separated from the chip mounted section. The semiconductor chip is mounted on the chip mounted section. Each of the chip parts is mounted on a surface of one the lead sections. Each of the chip parts has a first end portion and a second end portion in a direction perpendicular to the surface, and the first end portion is located on the surface. Each of the chip parts has an electrode at each of the first end portion and the second end portion. The resin member covers the lead frame, the semiconductor chip, and the chip parts. An edge portion of the chip mounted section is disposed on the second end portion of each of the plurality of the chip parts.

In the semiconductor device according to the seventh aspect, a dimension of the lead frame can be reduced, and thereby a dimension of the semiconductor device can be reduced.

BRIEF DESCRIPTION OF THE DRAWINGS

Additional objects and advantages of the present invention will be more readily apparent from the following detailed description of exemplary embodiments when taken together with the accompanying drawings. In the drawings.

DETAILED DESCRIPTION OF THE EXEMPLARY EMBODIMENTS

First Embodiment

Figure 1:
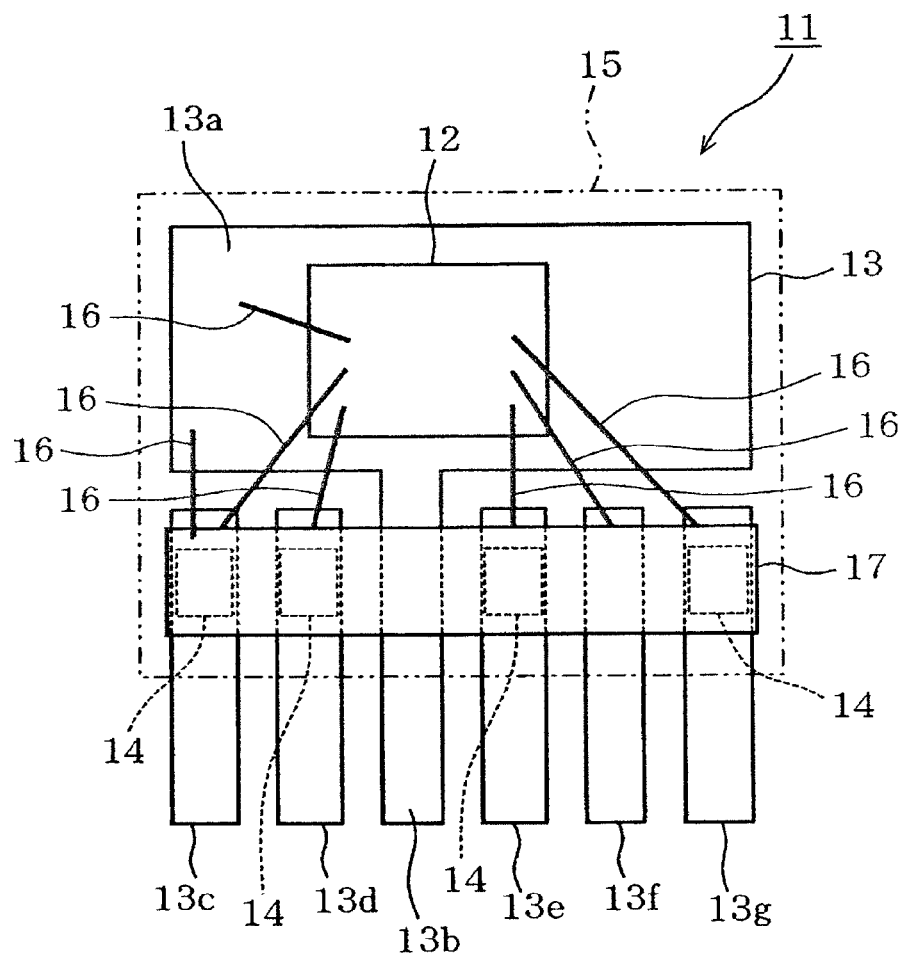
FIG. 1 is a top view of a semiconductor device according to a first embodiment of the present invention.
Figure 2:
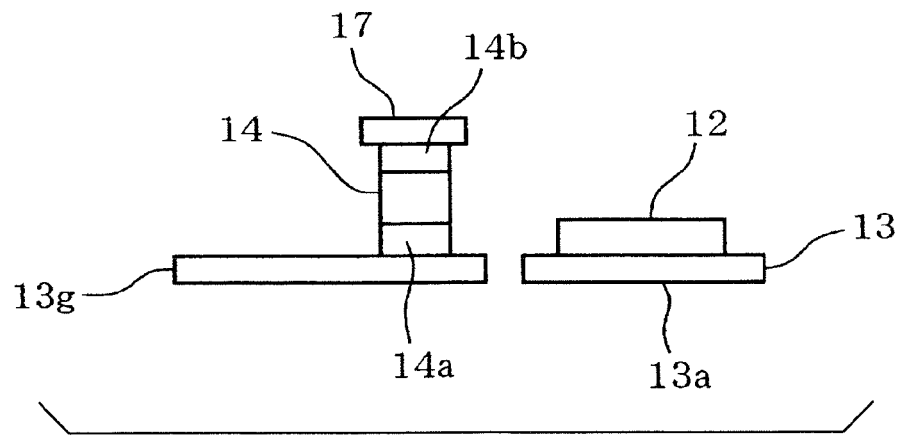
FIG. 2 is a side view of the semiconductor device viewed from a right side of FIG. 1.

A semiconductor device 11 according to a first embodiment of the present invention will be described with reference to FIG. 1 and FIG. 2. The semiconductor device 11 includes a semiconductor chip 12, a lead frame 13, a plurality of chip capacitors 14, and a resin member 15.

The lead frame 13 includes a chip mounted section 13a, a lead section 13b for a ground terminal, and a plurality of lead sections 13c-13g for various signals, and a connecting section (not shown) for connecting the chip mounted section 13a and the lead sections 13c-13g. The chip mounted section 13a has an approximately rectangular shape. The semiconductor chip 12 is attached on the chip mounted section 13a by bonding or soldering. The lead section 13b protrudes from a lower side of the chip mounted section 13a in an example illustrated in FIG. 1. The lead sections 13c-13g are arranged parallel to the lead section 13b. The connecting sections are removed when a manufacturing of the semiconductor device 11 is completed.

The semiconductor chip has a plurality of pads. Some pads of the semiconductor chip 12 and the lead sections 13c-13g of the lead frame 13 are bonded through wires 16 respectively. Other pad of the semiconductor chip 12 and the chip mounted section 13a integrated with the lead section 13b are also bonded through a wire 16.

The chip capacitors 14 are provided for reducing noise or static electricity. Each of the chip capacitors 14 is mounted vertically on a surface of one of the lead sections 13c-13g, as shown in FIG. 2. That is, each of the chip capacitors 14 has a first end portion and a second end portion in a direction perpendicular to the surface of a corresponding one of the lead section 13c-13g, and the first end portion is located on the surface. Each of the chip capacitors 14 has a first electrode 14a at the first end portion and a second electrode 14b at the second end portion. The first electrode 14a of each of the chip capacitors 14 is attached on the corresponding one of the lead sections 13c-13g by bonding with a conductive adhesive or soldering. On the second electrode 14b of each of the chip capacitors 14, a conductive plate 17 is attached by bonding with a conductive adhesive or soldering. The conductive plate 17 and the chip mounted section 13a of the lead frame 13 are bonded through a wire 16, and thereby the conductive plate 17 is coupled with a ground potential. The conductive plate 17 may also be coupled with another potential.

In the present embodiment, each of the chip capacitors (chip part) 14 is vertically mounted on corresponding one of the lead sections 13c-13g, and the conductive plate 17 is mounted on upper end portions of the chip capacitors 14. Thus, the chip capacitors 14 are not required to be arranged so as to bridge between the lead sections 13c-13g. As a result, a dimension of the lead frame 13 can be reduced, and thereby a dimension of the semiconductor device 11 can be reduced.

Second Embodiment

Figure 3:
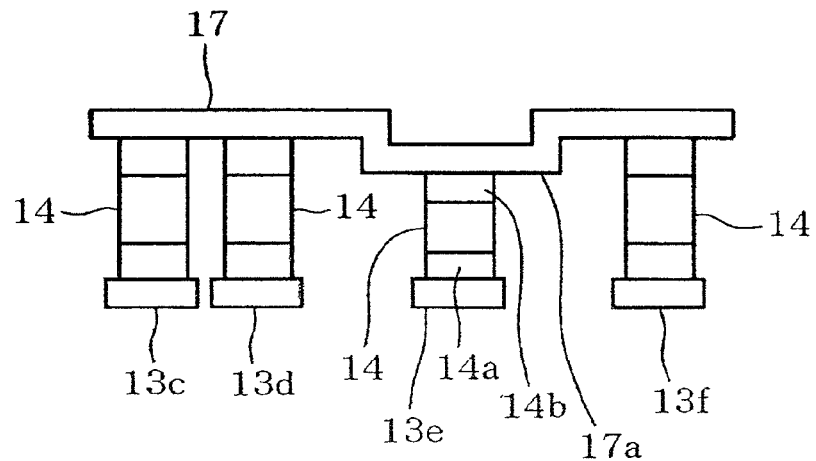
FIG. 3 is a side view of a semiconductor device according to a second embodiment of the present invention viewed from a direction corresponding to a lower side of FIG. 1.

A semiconductor device 11 according to a second of the present invention will be described with reference to FIG. 3. Components similar to those of the first embodiment are designated by the same reference numerals. In the present embodiment, each of chip capacitors 14 is mounted vertically on a surface of one of lead sections 13c-13f. That is, each of the chip capacitors 14 has a first end portion and a second end portion in a direction perpendicular to the surface of a corresponding one of the lead section 13c-13g, and the first end portion is located on the surface. Each of the chip capacitors 14 has a first electrode 14a at the first end portion and a second electrode 14b at the second end portion. The chip capacitors 14 have different lengths in the direction perpendicular to the surface of the lead sections 13c-13g. In an example illustrated in FIG. 3, one chip capacitor 14 (a second chip capacitor 14 from a right side) has a length less than other three chip capacitors 14. The conductive plate 17 has a protruding portion 17a at a portion corresponding to the one chip capacitors 14. The protruding part 17a protrudes downward so that a lower surface of the protruding part 17a is in contact with an upper surface of the second electrode 14b of the one chip capacitor 14.

Other configuration of the semiconductor device 11 according to the present embodiment is substantially similar to the semiconductor device 11 according to the first embodiment. Thus, the semiconductor device according to the present embodiment can have effects similar to those of the semiconductor device 11 according to the first embodiment. In addition, because the conductive plate 17 according to the present embodiment has the protruding portion 17a, the conductive plate 17 can be fixed with certainty to the chip capacitors 14 having different lengths. In a case where a chip capacitor 14 having a length greater than other chip capacitors 14 is mixed, the conductive plate 17 may have a protruding portion that protrudes upward, that is, a recessed portion. Thus, the conductive plate 17 may have one of the protruding portion 17a and the recessed portion so as to correspond to the chip parts 14 having different lengths in the direction perpendicular the surfaces of the lead sections.

Third Embodiment

Figure 4:
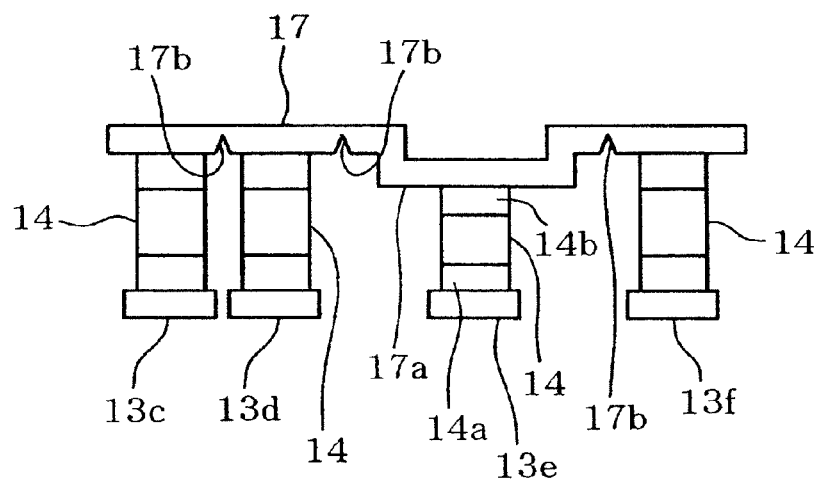
FIG. 4 is a side view of a semiconductor device according to a third embodiment of the present invention viewed from a direction corresponding to the lower side of FIG. 1.

A semiconductor device 11 according to a third embodiment of the present invention will be described with reference to FIG. 4. Components similar to those of the second embodiment are designated by the same reference numerals. In the present embodiment, the conductive plate 17 has grooves 17b adjacent to portions where the second end portion of the chip capacitors 14 are respectively attached. In the present case, when a the conductive plate 17 and the chip capacitors 14 are molded with resin, a force that applies to the chip capacitors 14 during a mold clamping can be reduced. Thus, a peeling off of the chip capacitors 14 can be restricted.

Fourth Embodiment

Figure 5:
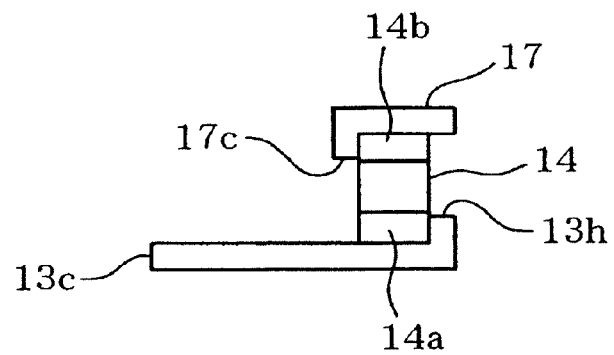
FIG. 5 is a side view of a chip capacitor, a lead section, and a conductive plate in a semiconductor device according to a fourth embodiment of the present invention viewed from a direction corresponding to the right side of FIG. 1.

A semiconductor device 11 according to a fourth embodiment of the present invention will be described with reference to FIG. 5. Components similar to those of the first embodiment are designated by the same reference numerals. In the present embodiment, the conductive plate 17 is bent into an L-shape so as to have a bent part 17c at a portion where the second electrodes 14b of the chip capacitors 14 are attached. In addition, each of the lead sections 13c-13g of the lead frame 13 is bent into an L-shape so as to have a bent part 13h at a portion where the first electrode 14a of the corresponding one of the chip capacitors 14 is attached.

The first electrode 14a of each of the chip capacitors 14 is bonded to the corresponding one of the lead sections 13c-13g so that the first electrode 14a is in contact with the bent part 13h. The second electrode 14b of each of the chip capacitors 14 is bonded to the conductive plate 17 so that the second electrode 14b is in contact with the bent part 17c of the conductive plate 17. In the present case, the chip capacitors 14 are fixed with certainty to the lead sections 13c-13g and the conductive plate 17. Other configuration of the semiconductor device 11 according to the present embodiment is substantially similar to the semiconductor device 11 according to the first embodiment. Thus, the semiconductor device according to the present embodiment can have effects similar to those of the semiconductor device 11 according to the first embodiment.

Fifth Embodiment

Figure 6:
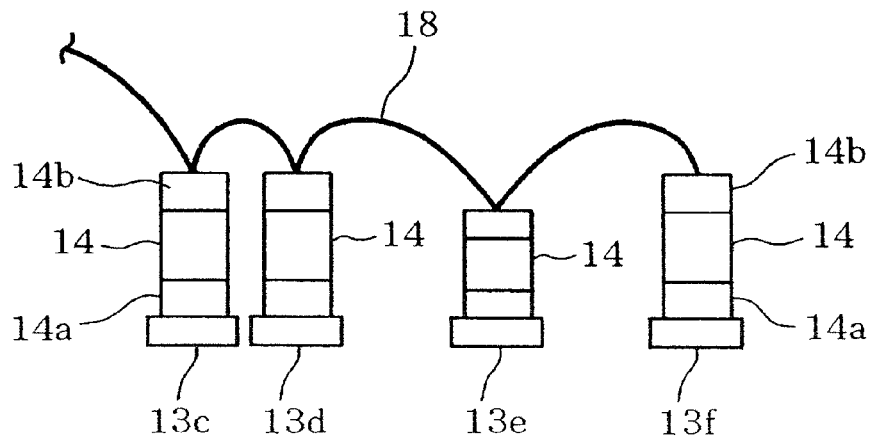
FIG. 6 is a side view of a semiconductor device according to a fifth embodiment of the present invention viewed from a direction corresponding to a lower side of FIG. 1.

A semiconductor device 11 according to a fifth embodiment of the present invention will be described with reference to FIG. 6. Components similar to those of the second embodiment are designated by the same reference numerals. In the present embodiment, the second electrodes 14b of the chip capacitors 14 are coupled with each other through a wire 18 instead of the conductive plate 17. The wire 18 may be coupled with the ground potential or another potential. Other configuration of the semiconductor device 11 according to the present embodiment is substantially similar to the semiconductor device 11 according to the second embodiment. Thus, the semiconductor device 11 according to the present embodiment can have effects similar to those of the semiconductor device 11 according to the second embodiment.

Sixth Embodiment

Figure 7:
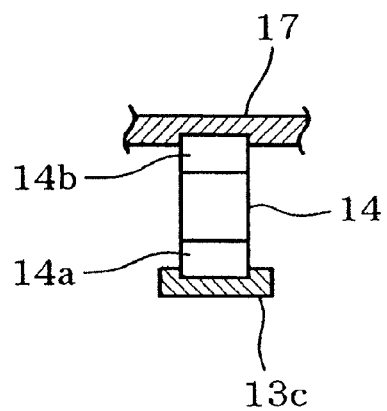
FIG. 7 is a cross-sectional view of a chip capacitor, a lead section, and a conductive plate in a semiconductor device according to a sixth embodiment of the present invention.
Figure 8A:
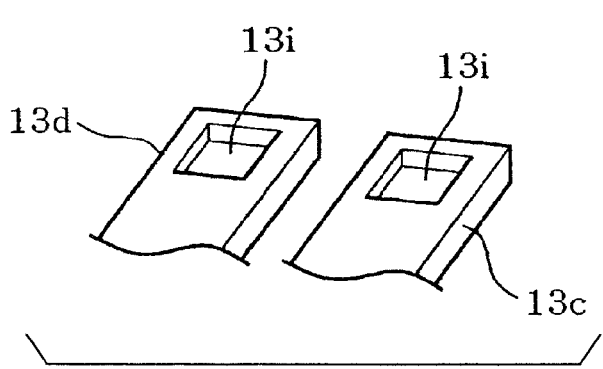
FIG. 8A is a perspective view of the lead sections and FIG. 8B is a perspective view of the conductive plate.
Figure 8B:
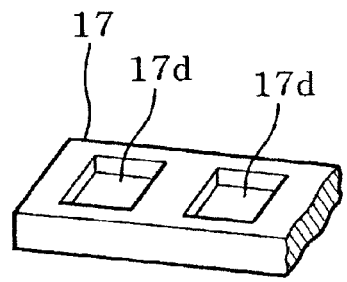

A semiconductor device 11 according to a sixth embodiment of the present invention will be described with reference to FIG. 7, FIG. 8A and FIG. 8B. Components similar to those of the first embodiment are designated by the same reference numerals. The conductive plate 17 has recessed portions 17d into which the second electrodes 14b of the chip capacitors 14b are fitted respectively. Each of the lead sections 13c-13g of the lead frame 13 has a recessed portion 13i into which the first electrode 14a of one of the chip capacitors 14 is fitted. The second electrode 14b of each of the chip capacitors 14 is bonded to the conductive plate 17 in a state where the second electrode 14b is fitted in one of the recessed portions 17d. The first electrode 14a of each of the chip capacitors 14 is bonded to one of the lead section 13c-13g in a state where the first electrode 14a is fitted in the recessed portion 13i provided in the corresponding one of the lead section 13c-13g.

In the present case, the chip capacitors 14 are fixed with certainty to the lead sections 13c-13g and the conductive plate 17. Other configuration of the semiconductor device 11 according to the present embodiment is substantially similar to the semiconductor device 11 according to the first embodiment. Thus, the semiconductor device 11 according to the present embodiment can have effects similar to those of the semiconductor device 11 according to the first embodiment.

Seventh Embodiment

Figure 9:
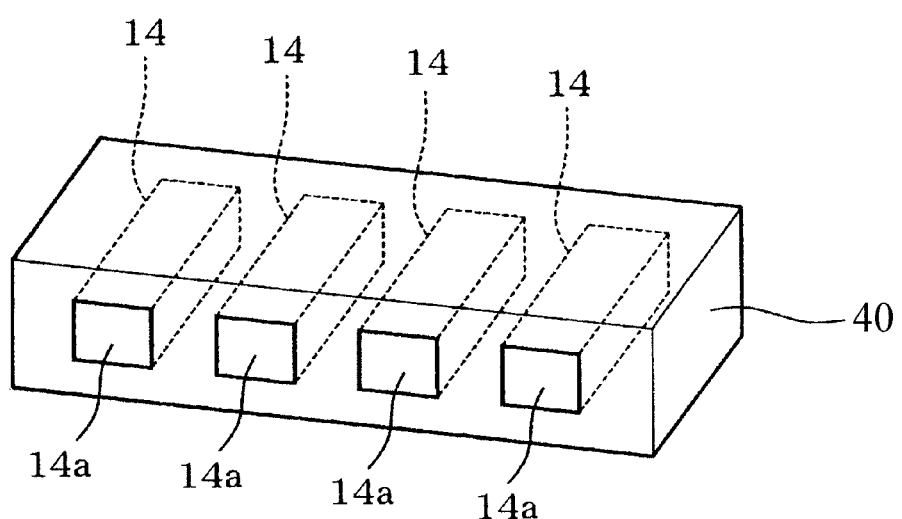
FIG. 9 is a perspective view of a chip capacitors sealed with a resin part according to a seventh embodiment of the present invention.

A semiconductor device 11 according to a seventh embodiment of the present invention will be described with reference to FIG. 9. Components similar to those of the first embodiment are designated by the same reference numerals. In the present embodiment, the chip capacitors 14 are previously sealed with resin part 40 in such a manner that end surfaces of the first electrodes 14a and the second electrodes 14b are exposed to an outside of the resin part 40.

Other configuration of the semiconductor device 11 according to the present embodiment is substantially similar to the semiconductor device 11 according to the first embodiment. Thus, the semiconductor device 11 according to the present embodiment can have effects similar to the semiconductor device 11 according to the first embodiment. In addition, because the chip capacitors 14 are previously sealed with the resin part 40, a handling of the chip capacitors 14 can be improved, and thereby a productivity of the semiconductor device 11 can be improved.

Eighth Embodiment

A semiconductor device 11 according to an eighth embodiment of the present invention will be described with reference to FIG. 10. Components similar to those of the first embodiment are designated by the same reference numerals. In the present embodiment, a lead frame 13 includes a plurality of lead sections 19. Each of the chip capacitors 14 is horizontally disposed on a surface of one of the lead sections 19. That is, each of the chip capacitors 14 has a first end portion and a second end portion in a direction parallel to the surface of corresponding one of the lead sections 19, and each of the chip capacitors 14 has a first electrode 14a at the first end portion and a second electrode 14b at the second end portion. The first electrode 14a of each of the chip capacitors 14 is bonded with the corresponding one of the lead sections 19 through a conductive adhesive 20. The second electrode 14b of each of the chip capacitors 14 is bonded with the corresponding one of the lead sections 19 through an insulating adhesive 21.

On the chip capacitors 14, the conductive plate 17 coupled with the ground potential is bonded. The first electrode 14a of each of the chip capacitors 14 is bonded with the conductive plate 17 through the insulating adhesive 21. The second electrode 14b of each of the chip capacitors 14 is bonded with the conductive plate 17 through the conductive adhesive 20. Other configuration of the semiconductor device 11 according to the present embodiment is substantially similar to the semiconductor device 11 according to the first embodiment. Thus, the semiconductor device 11 according to the present embodiment can have effects similar to those of the semiconductor device 11 according to the first embodiment.

Figure 10:
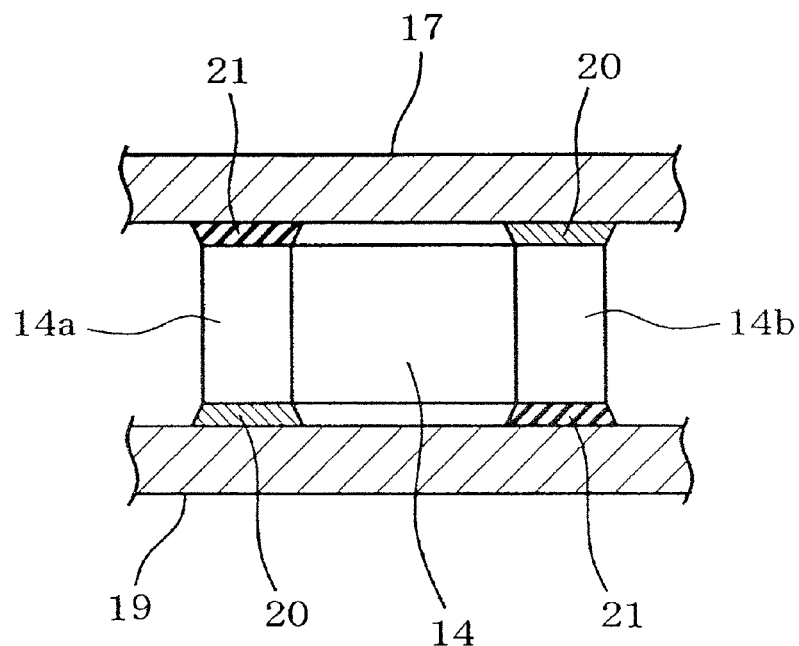
FIG. 10 is a cross-sectional view of a chip capacitor, a lead section, and a conductive plate according to an eighth embodiment of the present invention.

In the example illustrated in FIG. 10, the second electrode 14b of each of the chip capacitors 14 is coupled with the conductive plate 17. Alternatively, the second electrode 14b of each of the chip capacitors 14 may be bonded with wire coupled to the ground potential.

Ninth Embodiment

Figure 11:
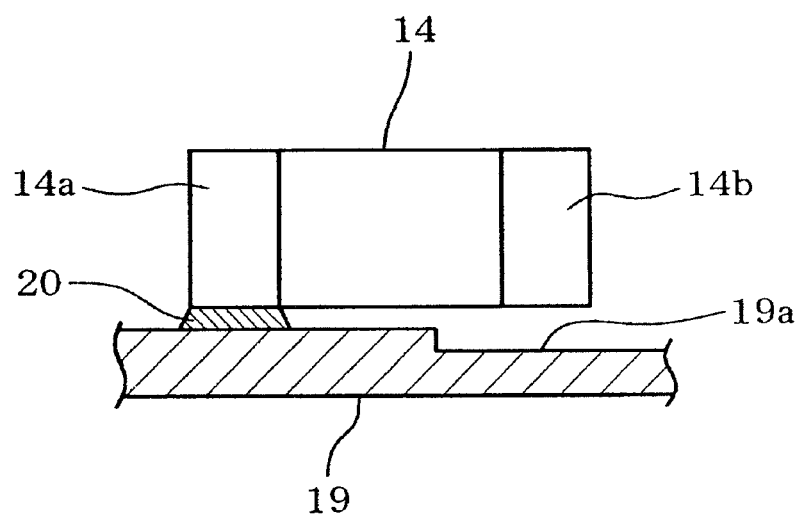
FIG. 11 is a cross-sectional view of a chip capacitor and a lead section according to a ninth embodiment of the present invention.

A semiconductor device 11 according to a ninth embodiment of the present invention will be described with reference to FIG. 11. Components similar to those of the eighth embodiment are designated by the same reference numerals. In the present embodiment, each of the lead sections 19 has a recessed portion 19a so that the electrode 14b of each of the chip capacitors 14 is not in contact with corresponding one of the lead sections 19. Other configuration of the semiconductor device 11 according to the present embodiment is substantially similar to the semiconductor device 11 according to the eighth embodiment. Thus, the semiconductor device 11 according to the present embodiment can have effects similar to those of the semiconductor device 11 according to the eighth embodiment.

Tenth Embodiment

Figure 12:
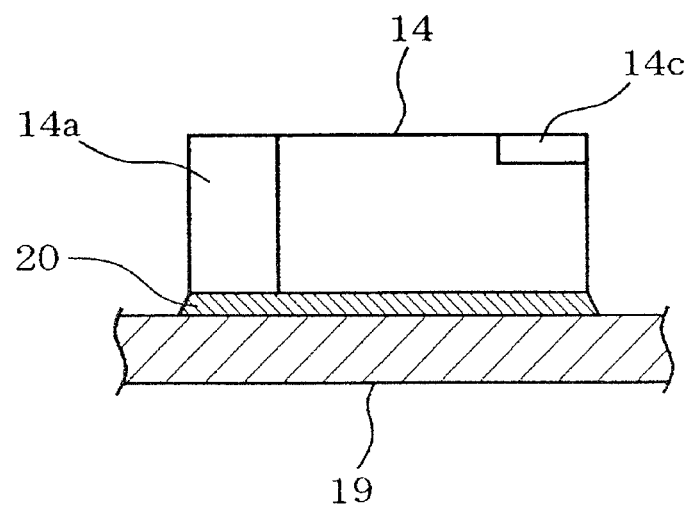
FIG. 12 is a cross-sectional view of a chip capacitor and a lead section according to a tenth embodiment of the present invention.

A semiconductor device 11 according to a tenth embodiment of the present invention will be described with reference to FIG. 12. Components similar to those of the eighth embodiment are designated by the same reference numerals. In the present embodiment, each of the chip capacitors 14 is horizontally disposed on a surface of one of the lead sections 19. That is, each of the chip capacitors 14 has a first end portion and a second end portion in a direction parallel to the surface of corresponding one of the lead sections 19. Each of the chip capacitors 14 has a first electrode 14a at the first end portion and a second electrode 14c at an upper part of the second end portion. The whole lower surface of each of the chip capacitors 14 is bonded with a corresponding one of the lead sections 19 through the conductive adhesive 20. Other configuration of the semiconductor device 11 according to the present embodiment is substantially similar to the semiconductor device 11 according to the eighth embodiment. Thus, the semiconductor device 11 according to the present embodiment can have effects similar to those of the semiconductor device 11 according to the eighth embodiment.

Eleventh Embodiment

Figure 13:
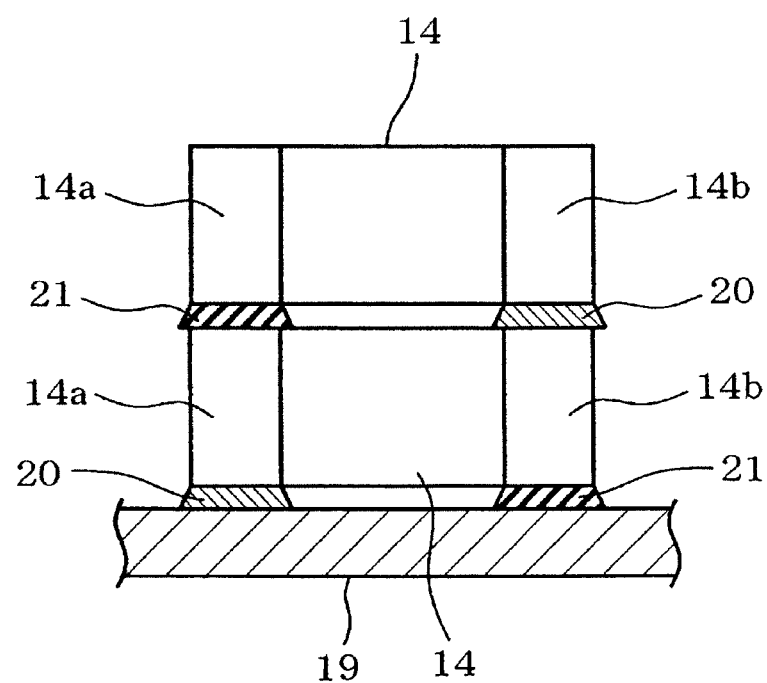
FIG. 13 is a cross-sectional view of chip capacitors and a lead section according to an eleventh embodiment of the present invention.

A semiconductor device 11 according to an eleventh embodiment of the present invention will be described with reference to FIG. 13. Components similar to those of the eighth embodiment are designated by the same reference numerals. In the present embodiment, two chip capacitors 14 are stacked and are coupled in series. The first electrode 14a of a lower chip capacitor 14 and the first electrode 14a of an upper chip capacitor 14 are bonded through the insulating adhesive 21. The second electrode 14b of the lower chip capacitor 14 and the second electrode 14b of the upper chip capacitor 14 are bonded through the conductive adhesive 20. In addition, a wire (not shown) coupled to the ground potential is bonded with the first electrode 14a of the upper chip capacitor 14.

Other configuration of the semiconductor device 11 according to the present embodiment is substantially similar to the semiconductor device 11 according to the eighth embodiment. Thus, the semiconductor device 11 according to the present embodiment can have effects similar to those of the semiconductor device 11 according to the first embodiment. In addition, because the chip capacitors 14 are stacked and are coupled in series, a capacity of the chip capacitors 14 can be easily controlled. The number of chip capacitors 14 stacked and coupled in series may also be more than two.

Twelfth Embodiment

Figure 14:
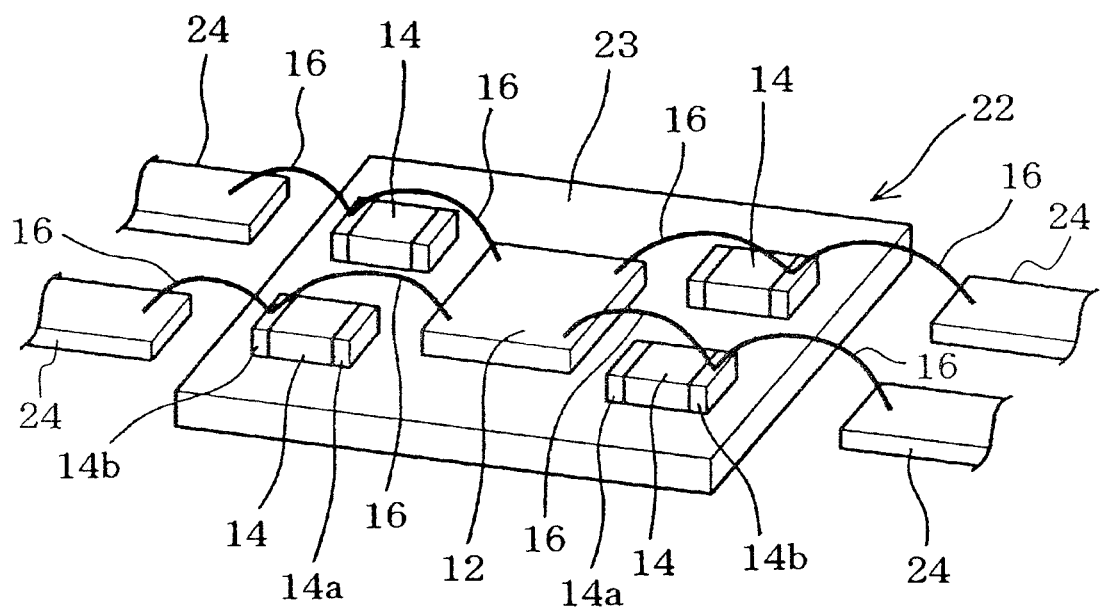
FIG. 14 is a perspective view of a part of a semiconductor device according to a twelfth embodiment of the present invention.

A semiconductor device 11 according to a twelfth embodiment of the present invention will be described with reference to FIG. 14. Components similar to those of the eighth embodiment are designated by the same reference numerals. In the present embodiment, the semiconductor device 11 includes a lead frame 22. The lead frame 22 includes a chip mounted section 23 and a plurality of lead sections 24. The chip capacitors 14 are bonded on the chip mounted section 23 of the lead frame 22. The first electrode 14a of each of the chip capacitors 14 is bonded on the chip mounted section 23 through a conductive adhesive 20. The second electrode 14b of each of the chip capacitors 14 is bonded on the chip mounted section 23 through an insulating adhesive 21.

The second electrode 14b of each of the chip capacitors 14 is coupled with one of the pads of the semiconductor chip 12 through a wire 16. In addition, the second electrode 14b of each of the chip capacitors 14 is coupled with one of lead sections 24 of the lead frame 22 through a wire 16. Other configuration of the semiconductor device 11 according to the present embodiment is substantially similar to the semiconductor device 11 according to the eighth embodiment. Thus, the semiconductor device 11 according to the present embodiment can have effects similar to those of the semiconductor device 11 according to the eighth embodiment. In addition, in the present embodiment, the chip capacitors 14 are bonded on the chip mounted section 23 so that the chip capacitors 14 are arranged adjacent to the semiconductor chip 12. Thus, the semiconductor device 11 can reduce a noise level. In particular, when a power element is used as the semiconductor chip 12, the semiconductor device 11 can reduce a noise level more effectively In the example illustrated in FIG. 14, the chip capacitors 14 are horizontally disposed on the chip mounted section 23. The chip capacitors 14 may also be vertically disposed on the chip mounted section 23. In the example illustrate in FIG. 14, all the chip capacitors 14 are bonded on the chip mounted section 23. Alternatively, a part of the chip capacitors 14 may also bonded on the lead sections 24.

Thirteenth Embodiment

Figure 15:
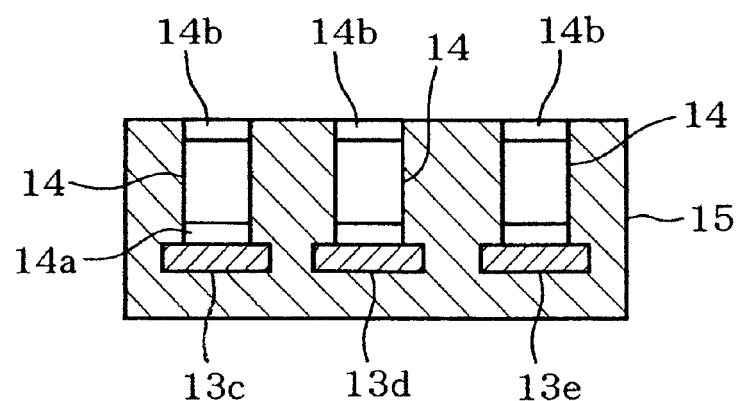
FIG. 15 is a cross-sectional view of a semiconductor device according to a thirteenth embodiment of the present invention.
Figure 16:
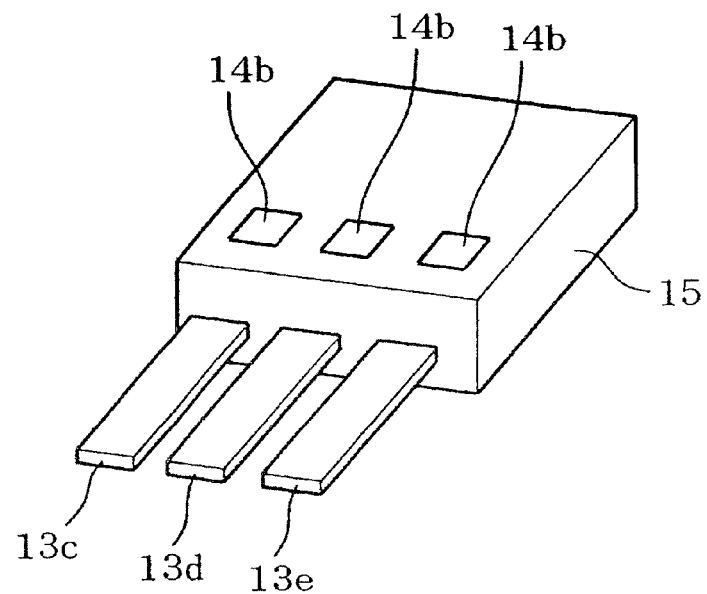
FIG. 16 is a perspective view of a semiconductor device according to the thirteenth embodiment.

A semiconductor device 11 according to a thirteenth embodiment of the present invention will be described with reference to FIG. 15 and FIG. 16. Components similar to those of the first embodiment are designated by the same reference numerals. In the present embodiment, the conductive plate 17 is not bonded on the chip capacitors 14. When all components are molded with the resin member 15, upper surfaces of the second electrodes 14b of the chip capacitors 14 are exposed to an outside of the resin member 15. In the present configuration, when the semiconductor device 11 molded with the resin member 15 is mounted on a wiring board (not shown), the exposed second electrodes 14b are coupled with a ground pattern of the wiring board through wires.

Other configuration of the semiconductor device 11 according to the present embodiment is substantially similar to the semiconductor device 11 according to the first embodiment. Thus, the semiconductor device 11 according to the present embodiment can have effects similar to those of the semiconductor device 11 according to the first embodiment.

Fourteenth Embodiment

Figure 17:
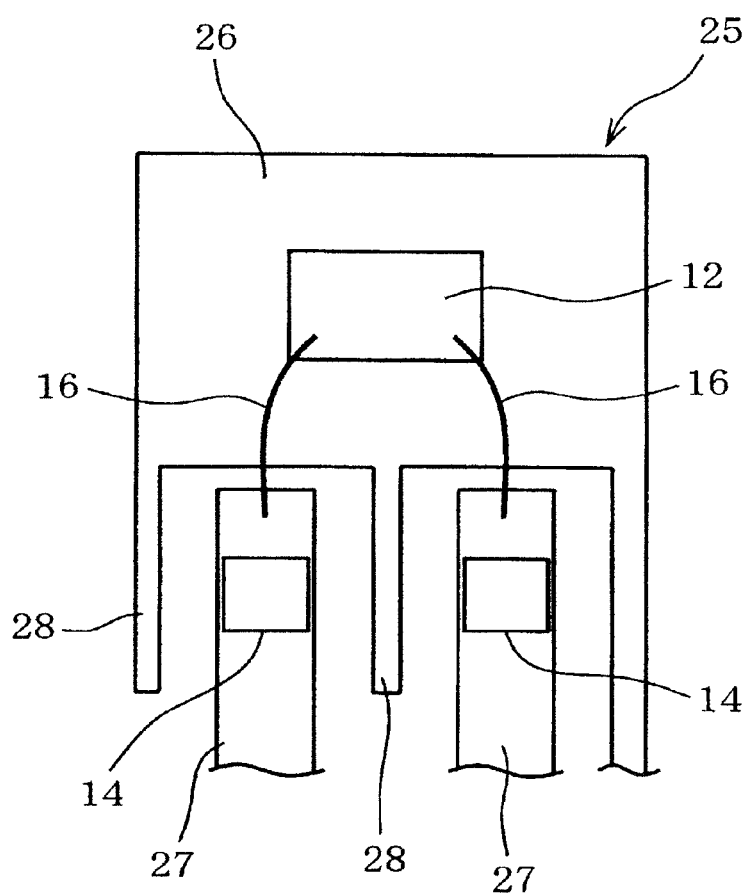
FIG. 17 is a top view of a semiconductor device according to a fourteenth embodiment of the present invention.
Figure 18:
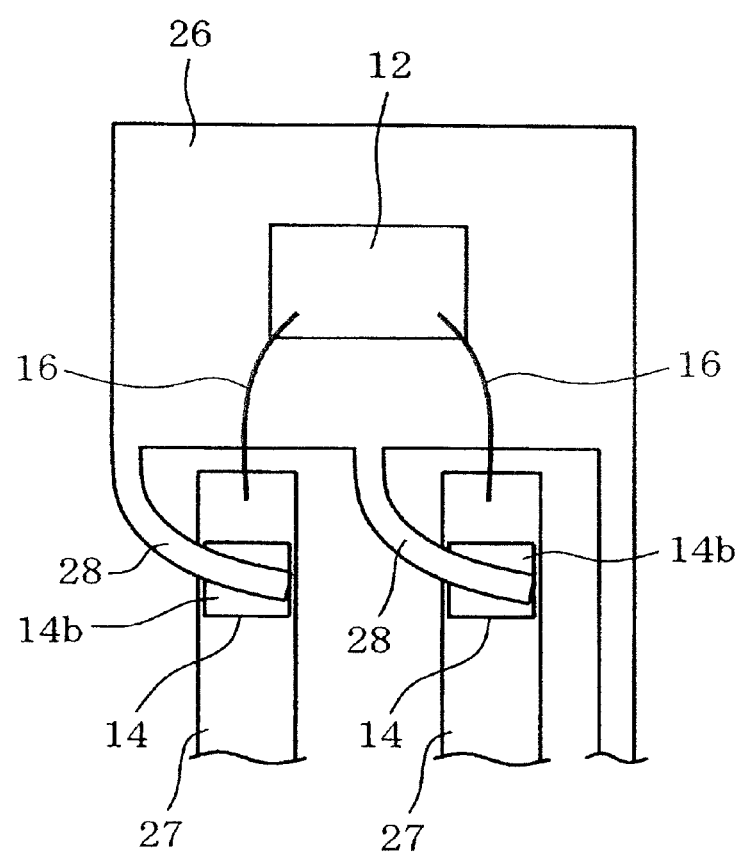
FIG. 18 is a top view of a semiconductor device in which lead parts for a ground potential are deformed and end portions of the lead parts are attached to electrodes respectively.

A semiconductor device 11 according to a fourteenth embodiment of the present invention will be described with reference to FIG. 17 and FIG. 18. Components similar to those of the first embodiment are designated by the same reference numerals. The semiconductor device 11 according to the present embodiment includes a lead frame 25. The lead frame 25 includes lead sections 27 and lead parts 28 for a ground potential. Each of the chip capacitors 14 is vertically disposed on a surface of one of the lead sections 27. The lead sections 27 and the lead parts 28 are arranged in parallel with each other. An end portion of each of the lead parts 28 is bent and is disposed on the second electrode 14b of one of the chip capacitors 14, as illustrated in FIG. 18. The lead parts 28b may be coupled with the ground potential or another potential.

Other configuration of the semiconductor device 11 according to the present embodiment is substantially similar to the semiconductor device 11 according to the first embodiment. Thus, the semiconductor device 11 according to the present embodiment can have effects similar to those of the semiconductor device 11 according to the first embodiment. In addition, because each of the lead parts 28 integrally formed with the chip mounted section 26 is deformed and the end portion of each of the lead parts 28 is bonded on the second electrode 14b of one of the chip capacitors 14, the conductive plate 17 and the wires 16 can be omitted. Thus, the number of components can be reduced.

Fifteenth Embodiment

Figure 19:
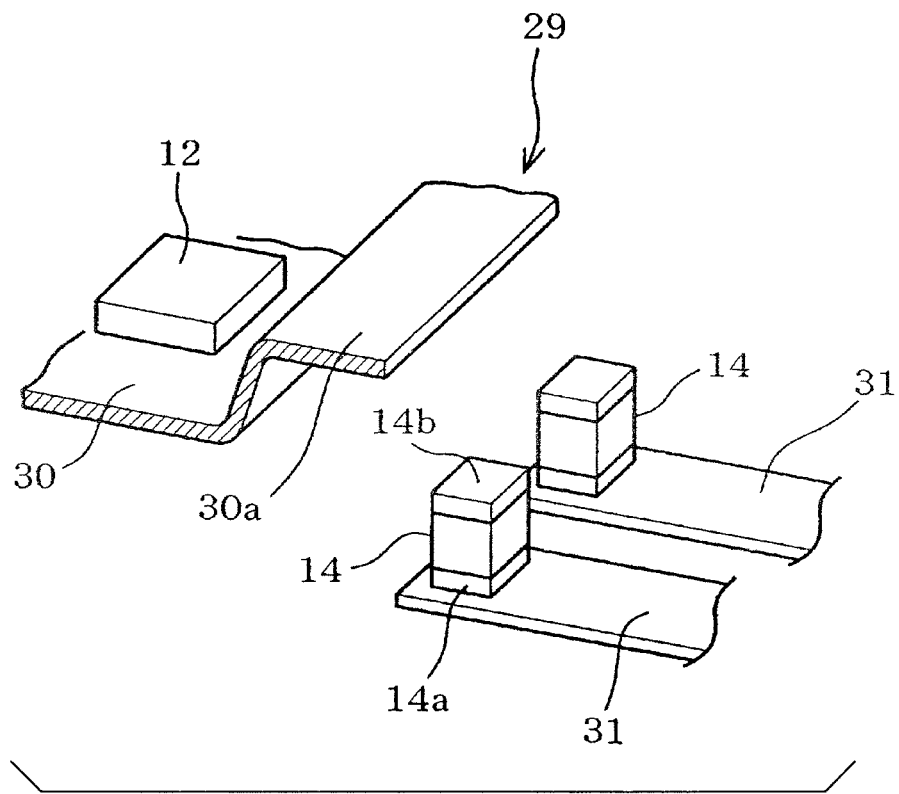
FIG. 19 is a perspective view of a part of a semiconductor device according to a fifteenth embodiment of the present invention.
Figure 20:
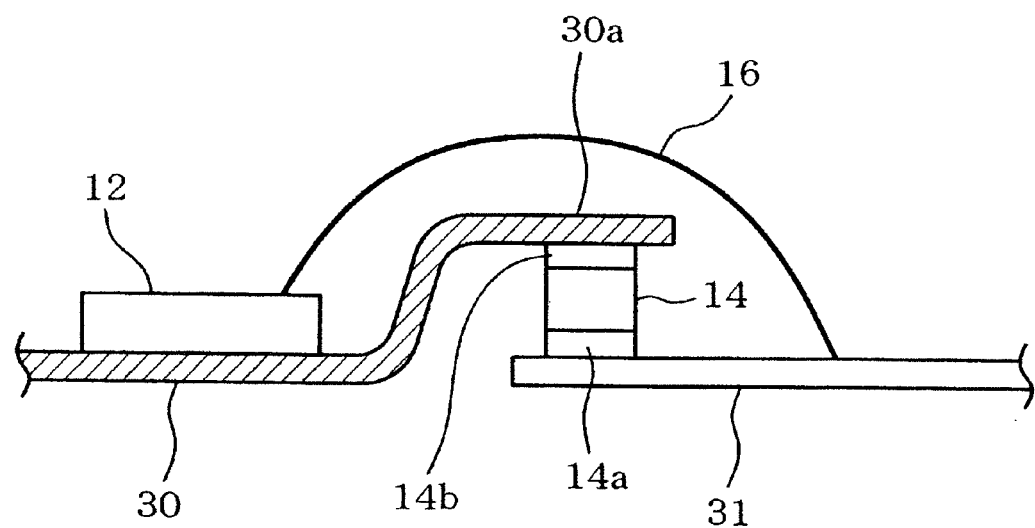
FIG. 20 is a cross-sectional view of a part of the semiconductor device according to the fifteenth embodiment.

A semiconductor device 11 according to a fifteenth embodiment of the present invention will be described with reference to FIG. 19 and FIG. 20. Components similar to those of the first embodiment are designated by the same reference numerals. The semiconductor device 11 according to the present embodiment includes a lead frame 29. The lead frame 29 includes a chip mounted section 30 and lead sections 31 which are separated from each other. The chip mounted section 30 has an approximately rectangular shape, and the lead sections 31 surround four sides of the chip mounted section 30. Base ends of the lead sections 31 are integrally coupled with each other at a frame part (not shown). The chip mounted section 30 has edge portions 30a at the four sides thereof. Each of the edge portions 30a is bent and having a flange shape.

Each of the chip capacitors 14 is vertically disposed on a surface of one of the lead sections 31. The edge portions 30a are bonded on the second electrode 14b of each of the chip capacitors 14. Each of the lead sections 31 and an electrode of the semiconductor chip 12 are coupled through wires 16. The edge portions 30a may be coupled with another potential. Other configuration of the semiconductor device 11 according to the present embodiment can be similar to the semiconductor device 11 according to the first embodiment. Thus, the semiconductor device 11 according to the present embodiment can have effects similar to those of the semiconductor device 11 according to the first embodiment. In addition, in the present embodiment, the edge portions 30a of the chip mounted section 30 are bonded with the second electrodes 14b of the chip capacitors 14 bonded on the lead sections 31. Thus, the conductive plate 17 and the wires 16 are not required and the number of components can be reduced.

Sixteenth Embodiment

Figure 21:
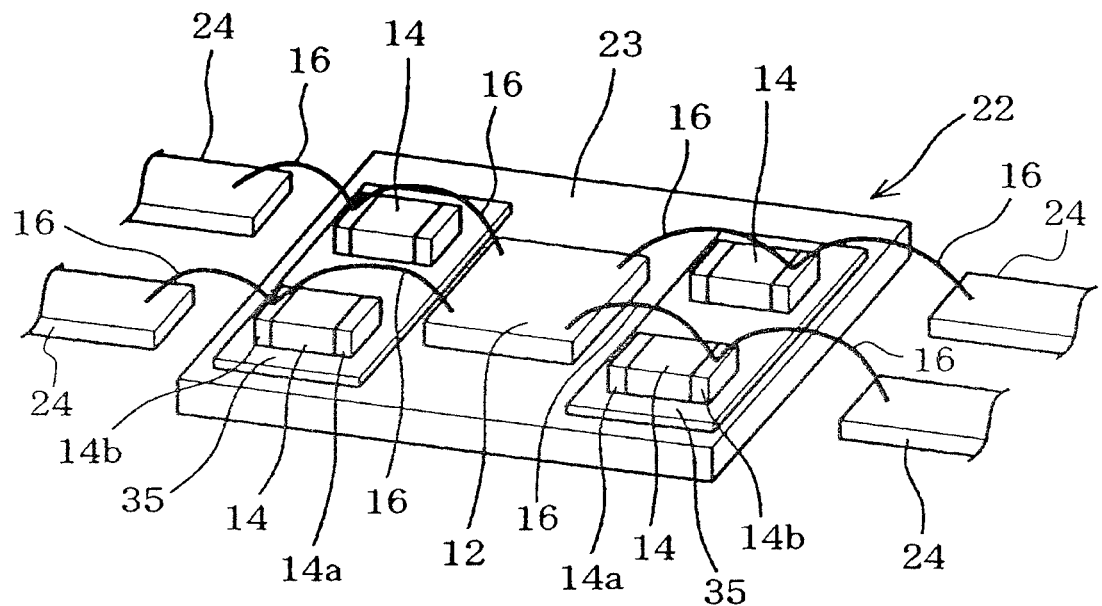
FIG. 21 is a perspective view of a part of a semiconductor device according to a sixteenth embodiment of the present invention.

A semiconductor device 11 according to a sixteenth embodiment of the present invention will be described with reference to FIG. 21. Components similar to those of the twelfth embodiment are designated by the same reference numerals. In the present embodiment, two chip capacitors 14 are disposed on an insulating substrate 35, and anther two chip capacitors 14 are disposed on another insulating substrate 35. The first electrode 14a of each of the chip capacitors 14 is bonded with a conductive pattern on the insulating substrate 35 through a conductive adhesive 20. The second electrode 14b of each of the chip capacitors 14 is bonded with the insulating substrate 35 through an insulating adhesive 21 or the conductive adhesive 20. The insulating substrates 35 each attached with the two chip capacitors 14 are bonded on the chip mounted section 23 through the insulating adhesive 21 or the conductive adhesive 20.

The second electrode 14b of each of the chip capacitors 14 is coupled with one of pads (electrodes) of the semiconductor chip 12 through a wire 16. In addition, the second electrode 14b of each of the chip capacitors 14 is coupled with one of the lead sections 24 of the lead frame 22 through a wire 16. Furthermore, the conductive pattern (the first electrode 14a of each of the chip capacitors 14) and a predetermined lead section 24 of the lead frame 22 or a predetermined pad of the semiconductor chip 12 are coupled through a wire (not shown).

Other configuration of the semiconductor device 11 according to the present embodiment is substantially similar to the semiconductor device 11 according to the twelfth embodiment. Thus, the semiconductor device 11 according to the present embodiment can have effects similar to those of the semiconductor device 11 according to the twelfth embodiment. In the present embodiment, the two chip capacitors 14 are bonded on the insulating substrate 35. Thus, the first electrodes 14a of the two chip capacitors 14 can be easily coupled with a potential different from a potential (ground potential) of the chip mounted section 23.

In the above-described example, the insulating substrate 35 is used. Alternatively, a conductive substrate made of, for example, metal may also be used. In such a case, the first electrode 14a of each of the chip capacitors 14 may be bonded on the conductive substrate through the conductive adhesive 20 and the second electrode 14b of each of the chip capacitors 14 may be bonded on the conductive substrate through the insulating adhesive 21. Then, two conductive substrates each attached with the two chip capacitors 14 may be bonded on the chip mounted section 23 through the insulating adhesive 21.

Seventeenth Embodiment

Figure 22:
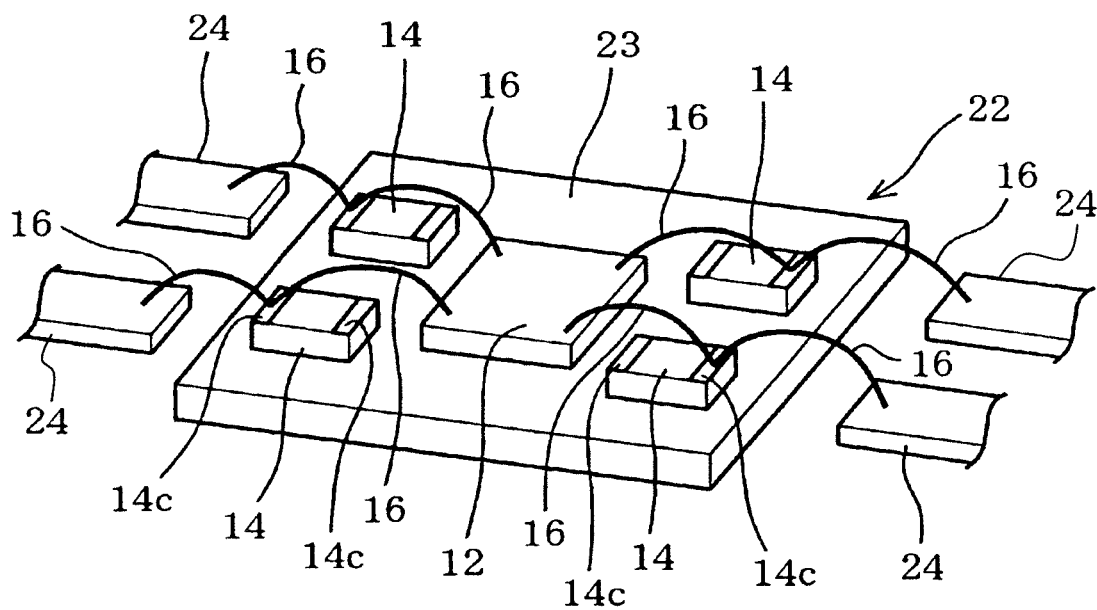
FIG. 22 is a perspective view of a part of a semiconductor device according to a seventeenth embodiment of the present invention.

A semiconductor device 11 according to a seventeenth embodiment of the present invention will be described with reference to FIG. 22. Components similar to those of the twelfth embodiment are designated by the same reference numerals. Each of the chip capacitors 14 is horizontally disposed on the chip mounted section 23. Each of the chip capacitors 14 has a first end portion and a second end portion in a direction parallel to a surface of the chip mounted section 23, and each of the chip capacitors 14 has an electrode 14c at an upper part of each of the first end portion and the second end portion. The whole surface of each of the chip capacitors 14 is bonded on the chip mounted section 23 through the conductive adhesive 20 or the insulating adhesive 21. Other configuration of the semiconductor device 11 according to the present embodiment is substantially similar to the semiconductor device 11 according to the twelfth embodiment. Thus, the semiconductor device 11 according to the present embodiment can have effects similar to those of the semiconductor device 11 according to the twelfth embodiment. In addition, in the present embodiment, each of the electrodes 14c located at the upper part of the chip capacitors 14 can be easily coupled with an electrode (a predetermined lead section 24 of the lead frame 22 or one of the pads of the semiconductor chip 12) at a potential different from a potential (ground potential) of the chip mounted section 23.

Eighteenth Embodiment

Figure 23:
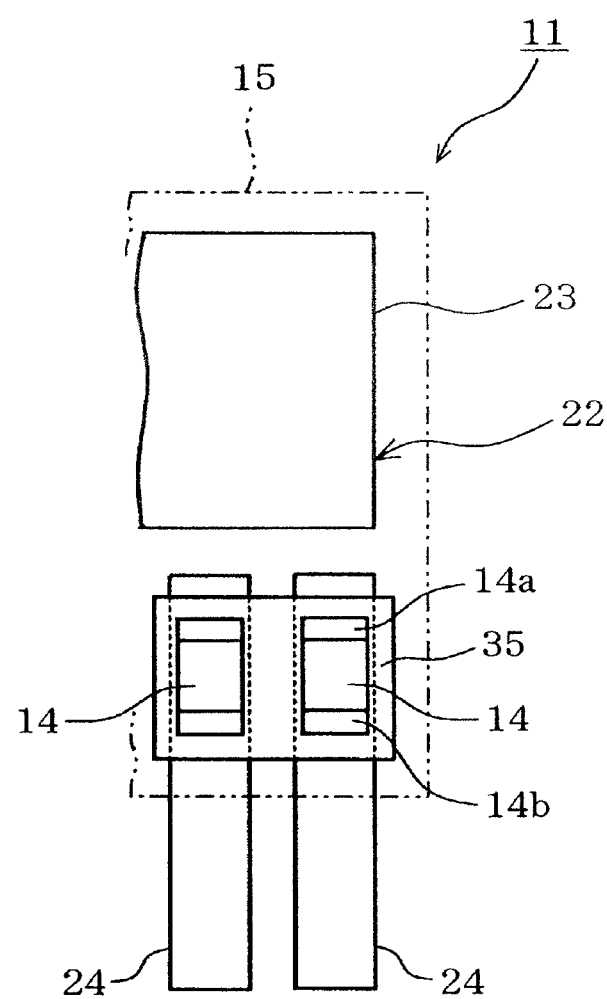
FIG. 23 is a top view of a part of a semiconductor device according to an eighteenth embodiment of the present invention.
Figure 24:
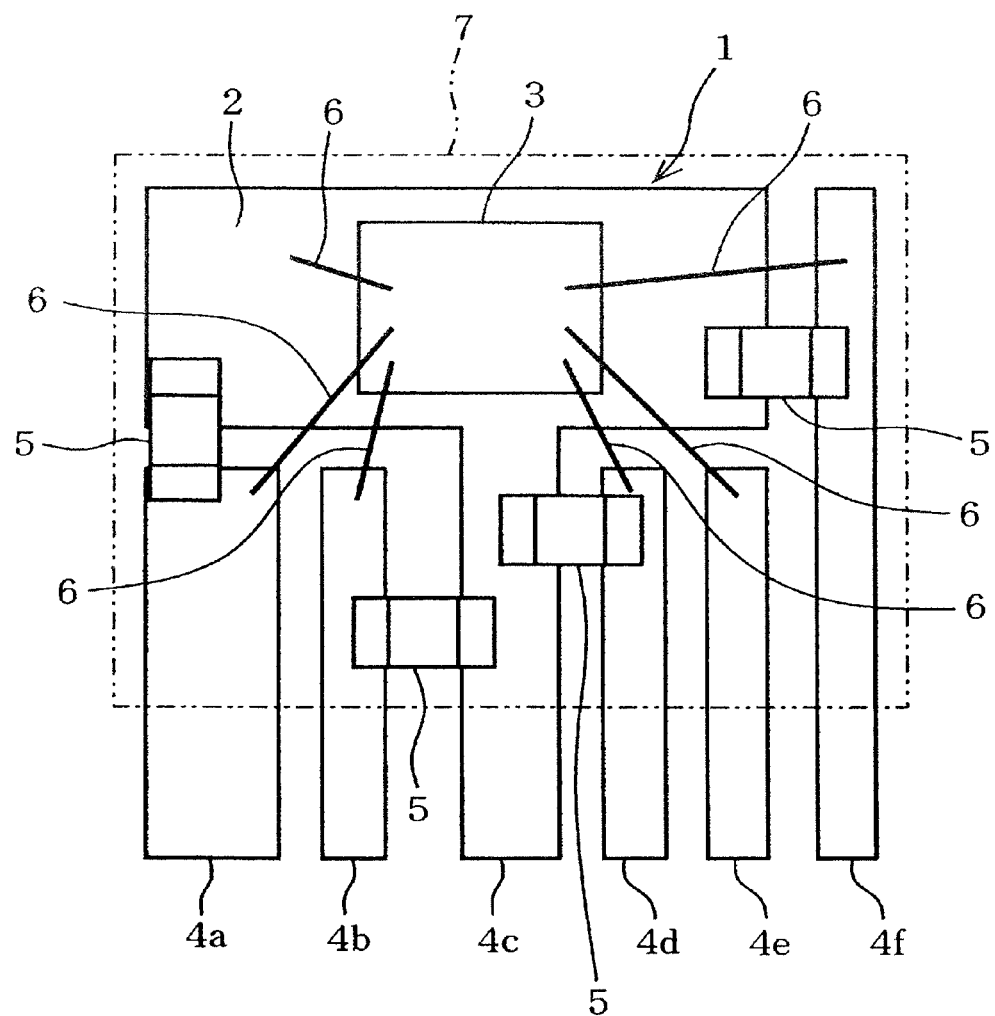
FIG. 24 is a top view of a semiconductor device according to an example of the related art.

A semiconductor device 11 according to an eighteenth embodiment of the present invention will be described with reference to FIG. 23. Components similar to those of the first embodiment or the sixteenth embodiment are designated by the same reference numerals. In the present embodiment, the insulating substrate 35 attached with a plurality of chip capacitors 14 (for example, two chip capacitors 14) is bonded on a plurality of lead sections 24 (for example, two lead sections 24) of the lead frame 22 so as to bridge between the lead sections 24. Other configuration of the semiconductor device 11 according to the present embodiment is similar to the semiconductor device 11 according to the sixteenth embodiment. Thus, the semiconductor device 11 according to the present embodiment can have effects similar to those of the semiconductor device 11 according to the sixteenth embodiment.

What is claimed is:

1. A semiconductor device comprising:
a lead frame including a chip mounted section and a plurality of lead sections, the chip mounted section having a surface;
a semiconductor chip mounted on the surface of the chip mounted section;
a plurality of chip parts mounted on the surface of the chip mounted section, each of the plurality of chip parts having a first end portion and a second end portion in a direction parallel to the surface of the chip mounted section, each of the plurality of chip parts having a first electrode at the first end portion and a second electrode at the second end portion;
a plurality of wires including a wire electrically coupling the second electrode of one of the plurality of chip parts and one of the plurality of lead sections and a wire electrically coupling the second electrode of one of the plurality of chips parts and the semiconductor chip;
a resin member covering the lead frame, the semiconductor chip, the plurality of chip parts, and the plurality of wires;
a conductive adhesive; and
an insulating adhesive,
wherein the first electrode of each of the plurality of chip parts is bonded with the chip mounted section through the conductive adhesive so that the first electrode is electrically coupled with the chip mounted section, and
wherein the second electrode of each of the plurality of chip parts is bonded with the chip mounted section through the insulating adhesive so that the second electrode is electrically insulated from the chip mounted section while being electrically coupled with the semiconductor chip and one of the plurality of lead sections through the wires, and the plurality of chip parts is arranged between required potentials.

2. The semiconductor device according to claim 1, wherein in the plurality of chip parts, the first electrode of each of the plurality of chip parts is disposed closer to the semiconductor chip than the second electrode, and the second electrode is disposed closer to the corresponding lead section than the first electrode.

* * * * *